United States Patent [19]
Chien et al.

[11] Patent Number: 5,496,776
[45] Date of Patent: Mar. 5, 1996

[54] SPIN-ON-GLASS PLANARIZATION PROCESS WITH ION IMPLANTATION

[75] Inventors: Sun-Cheih Chien; Chen-Chiu Hsue; Yu-Ju Liu, all of Hsin-Chu, Taiwan

[73] Assignee: United Microelectronics Corporation, Hsin-Chu, Taiwan

[21] Appl. No.: 429,809

[22] Filed: Apr. 27, 1995

[51] Int. Cl.$^6$ ................................................. H01L 21/469
[52] U.S. Cl. ........................... 437/231; 437/238; 437/240
[58] Field of Search .................................... 437/231, 238, 437/240, 225, 228, 195

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 427/38 |
| 4,885,262 | 12/1989 | Ting et al. | 437/231 |
| 5,003,062 | 3/1991 | Yen | 437/231 |
| 5,106,787 | 4/1992 | Yen | 437/231 |
| 5,192,697 | 3/1993 | Leong | 437/37 |
| 5,352,630 | 10/1994 | Kim et al. | 437/195 |

OTHER PUBLICATIONS

"Modification Effects in Ion–Implated SiO$_2$ Spin–On–Glass" by Moriya et al, 140, J. Electrochem Soc. 1442 (1993).

Primary Examiner—Mary Wilczewski
Assistant Examiner—H. Jey Tsai
Attorney, Agent, or Firm—George O. Saile; Alek Szecsy

[57] ABSTRACT

A spin-on-glass sandwich layer planarization process where the spin-on-glass layer within the sandwich has been ion implanted through its entire thickness. The spin-on-glass sandwich layer is formed by successive deposition of a silicon oxide layer, followed by a spin-on-glass layer. The spin-on-glass layer is then thermally cured and ion implanted throughout its entire thickness. Various combinations of implanting ions, ion doses and implantation energies are used to implant the spin-on-glass layer. Finally, a second silicon oxide layer is formed upon the surface of the spin-on-glass layer to complete the spin-on-glass sandwich layer.

10 Claims, 3 Drawing Sheets

SPIN-ON-GLASS PLANARIZATION PROCESS WITH ION IMPLANTATION

BACKGROUND OF THE INVENTION

1. Field of the Invention

This invention relates to a method of planarizing an integrated circuit device using a spin-on-glass composition. More particularly, this invention relates to a method of planarizing a submicron integrated circuit device using a spin-on-glass layer which is thermally cured and ion implanted throughout the entire thickness of the spin-on-glass layer, thus imparting to the spin-on-glass layer the characteristic of not being susceptible to sorption and outgassing of moisture.

2. Description of Related Art

Conventional processes used in production of integrated circuit devices include metallization processes which produce conductive pathways to connect various circuit elements, and dielectric deposition processes which form insulating layers between adjoining or overlapping conductive metal layers. In practice, such conventional processes will typically first involve the deposition of a blanket metal layer which is patterned by lithographic and etching techniques. A conformal dielectric layer, which is typically silicon oxide material, is then formed over the patterned metal layer.

These conventional metallization and dielectric processes are adequate for simple device structures and dimensions. However, as device structures and dimensions become more complex and intricate the conventional metallization and dielectric processes often approach their limits of utility. These limits can easily be exceeded in situations where a device structure has substantially differing feature heights. Such feature height differences may be encountered in integrated circuit devices having multiple or overlapping metallization schemes, which might include, for example, memory word lines and like structures in memory products.

The occurrence of substantially differing feature heights in a semiconductor device creates a dilemma in the choice of thickness of a conventional conformal dielectric layer for use in that device. In general, a thick conformal dielectric layer will provide the most complete planarization, thus ensuring adequate coverage of all features. Unfortunately, however, thick conformal dielectric layers are susceptible to void formation during the conformal coating process. In contrast, thin conformal dielectric layers are much less likely to form voids. However, they suffer from a separate set of deficiencies. These deficiencies include: (1) an inability of a thin conformal dielectric layer to form an adequately planar surface upon which additional device elements may be formed, and (2) an inability of a thin conformal dielectric layer to adequately protect an underlying metal layer.

These inherent limits in the use of conventional conformally coated dielectric layers in advanced semiconductor device structures have spurned the development of alternate methods and materials designed to provide void free planar dielectric layers. Spin-on-glass materials represent a class of such alternate materials which have been used to provide void free planar dielectric layers in advanced integrated circuits. Two common members of the class of spin-on-glass materials are: (1) the inorganic silicate type spin-on-glass, and (2) the organic functional siloxane type spin-on-glass.

Both silicate and siloxane spin-on-glass materials are usually provided as dilute solutions in appropriate solvents. To form a spin-on-glass layer, a spin-on-glass solution is deposited onto a semiconductor wafer surface and the wafer is spun at a high speed to produce a uniform layer of material from which much of the solvent has evaporated. Further removal of solvent can be accomplished through mild heating or vacuum treatment of the wafer surface. Multiple layers of spin-on-glass material may be formed upon an initial layer by repeated coating applications.

In order to achieve optimal characteristics, layers composed of spin-on-glass materials must be thoroughly cured. Curing is usually done at temperatures of between 425 C. to 450 C. for a time period of up to one hour. During the curing process significant chemical and physical changes occur in both silicate and siloxane type spin-on-glass layers.

In its most common application for planarization of a semiconductor surface, a spin-on-glass material is applied as the middle layer of a three layer sandwich dielectric composition. In this sandwich layer, a conformal oxide is first applied to the semiconductor surface. A spin-on-glass composition is then spin coated onto the conformal oxide and cured. Finally a second oxide layer is deposited upon the cured spin-on-glass layer.

Once a spin-on-glass sandwich layer has been produced on a semiconductor surface, vias may be lithographically etched through the layer for the purpose of connecting to an underlying metal layer. Conventional lithographic techniques may be used to etch vias through spin-on-glass sandwich layers. A common process step included in the conventional lithographic via etch process is the removal of the photoresist etch mask by an oxygen plasma ash process.

Unfortunately, the oxygen plasma ash process for via photoresist etch mask removal causes oxide damage to form on the exposed spin-on-glass layer within the etched via. This is consistent with the observations of Rutherfold, et al., Proc. of the IEEE 141 (1993), who have shown that oxygen plasmas cause an increase in Si-OH (silicon-hydroxyl) bonding and a decrease in Si-C (silicon-carbon) bonding in siloxane spin-on-glass layers. In turn, the oxide damage caused by the oxygen plasma has an affinity to adsorb moisture when exposed to ambient air. This adsorbed moisture will desorb from the spin-on-glass surface oxide during any subsequent vacuum processing. In situations where the subsequent vacuum processing involves metal deposition into spin-on-glass sandwich layer vias whose sidewalls have adsorbed moisture due to oxidation, problems are often encountered with moisture outgassing or high via resistance due to moisture induced via metal oxidation.

One method of addressing high via metal resistance caused by spin-on-glass surface moisture desorption is to provide an additional etch-back process step to remove surface moisture from the oxidized spin-on-glass in via sidewalls prior to deposition of metal into those vias. Although this method is usually successful it also has some disadvantages. First, this method increases semiconductor processing time. Second, this method may not provide comparable etch rates for the spin-on-glass layer and the conformal oxide layers. Variations in etch rates between those materials will cause undercut or overcut of the spin-on-glass sandwich structure providing opportunities for voids or other semiconductor reliability defects.

Several patents have described methods and problems associated with spin-on-glass planarization processes. For example, U.S. Pat. No. 5,003,062 to Yen describes a sandwich process in which the spin-on-glass material may be either silicate or siloxane. A vacuum degassing step is used within that process. U.S. Pat. No. 4,775,550 to Chu, et al. describes a spin-on-glass process having a very thick first insulating layer, on the order of 8,000 to 10,000 Angstroms.

Conformal insulator thicknesses in this range often experience voids. The aforementioned patent to Chu et al., as well as U.S. Pat. No. 4,676,867 to Elkins et al and U.S. Pat. No. 4,885,262 to Ting et al. each show spin-on-glass etchback processes with the use of a spin-on-glass sandwich dielectric.

In addition, U.S. Pat. No. 5,192,697 to Leong describes an ion implantation method which may be used in place of the conventional thermal method for curing of spin-on-glass layers. "Modification Effects in Ion-Implanted SiO2 Spin on Glass" by Moriya et al, 140 J. Electrochem. Soc. 1442 (1993), describes physical effects caused by ion implanting into silicate and siloxane spin-on-glass layers formed on silicon wafers.

Finally, a recent U.S. patent application (Ser. No. 08/224701, filed 8 Apr. 1994) by Liu, et al. from this laboratory describes an ion implant process for improving semiconductor process yields of devices which contain spin-on-glass sandwich layers. Both the Moriya et al. article and the patent application describe ion implantation processes which are similar to the processes of the present invention. However, both of those publications describe ion implant processes employing relatively high implant dosages and low implant energies where the implanted ions are limited to Arsenic, Silicon and Phosphorus.

SUMMARY OF THE INVENTION

A principal object of the present invention is to provide an effective and manufacturable method for planarizing an integrated circuit surface with a spin-on-glass sandwich layer, where the entire surface area of spin-on-glass exposed within a via etched through the spin-on-glass sandwich layer is not susceptible to sorption and outgassing of moisture.

Another object of the present invention is to provide an efficient method of planarizing an integrated circuit surface which does not result in metallurgy and high resistivity problems associated with metallic interconnections through vias etched through the planarizing layer.

In accord with the objects of this invention, a new method of planarizing an integrated circuit is described. The dielectric layers between the conductive layers of an integrated circuit are formed and planarized through a spin-on-glass sandwich process.

In this new spin-on-glass sandwich process, a conformal first silicon oxide layer is deposited over a metal layer. This oxide layer is covered with a spin-on-glass layer which is subsequently fully cured at elevated temperature. Ions are then implanted into and through the spin-on-glass layer using one of the following three conditions: (1) Silicon, Argon or Phosphorus implantation ions; 5E13 to 1E15 ions/cm2 implantation dose; 150 to 400 keV implantation energy; (2) Boron, Oxygen, Nitrogen or Fluorine implantation ions; 1E15 to 5E16 ions/cm2 implantation dose; 50 to 200 keV implantation energy; or (3) Arsenic implantation ions; 2E13 to 5E14 ions/cm2 implantation dose; 300 to 800 keV implantation energy. A second conformal silicon oxide layer is deposited thereover to form the Completed spin-on-glass sandwich layer.

Via openings can now be made through the spin-on-glass sandwich layer and filled with metal. Planarity of the process is excellent, and the via surfaces are not susceptible to moisture sorption, the outgassing of which during via metallization processing may corrode the metal within the via and cause high via resistance. This method may be used for submicron technologies having conductor lines spaced from one another by submicron distances. This method eliminates the need for an etch back process for the spin-on-glass exposed within the etched vias prior to metal deposition into those etched vias.

BRIEF DESCRIPTION OF THE DRAWINGS

The accompanying drawings, which form a material part of this description, show the following.

DESCRIPTION OF THE PREFERRED EMBODIMENTS

Figure 1:
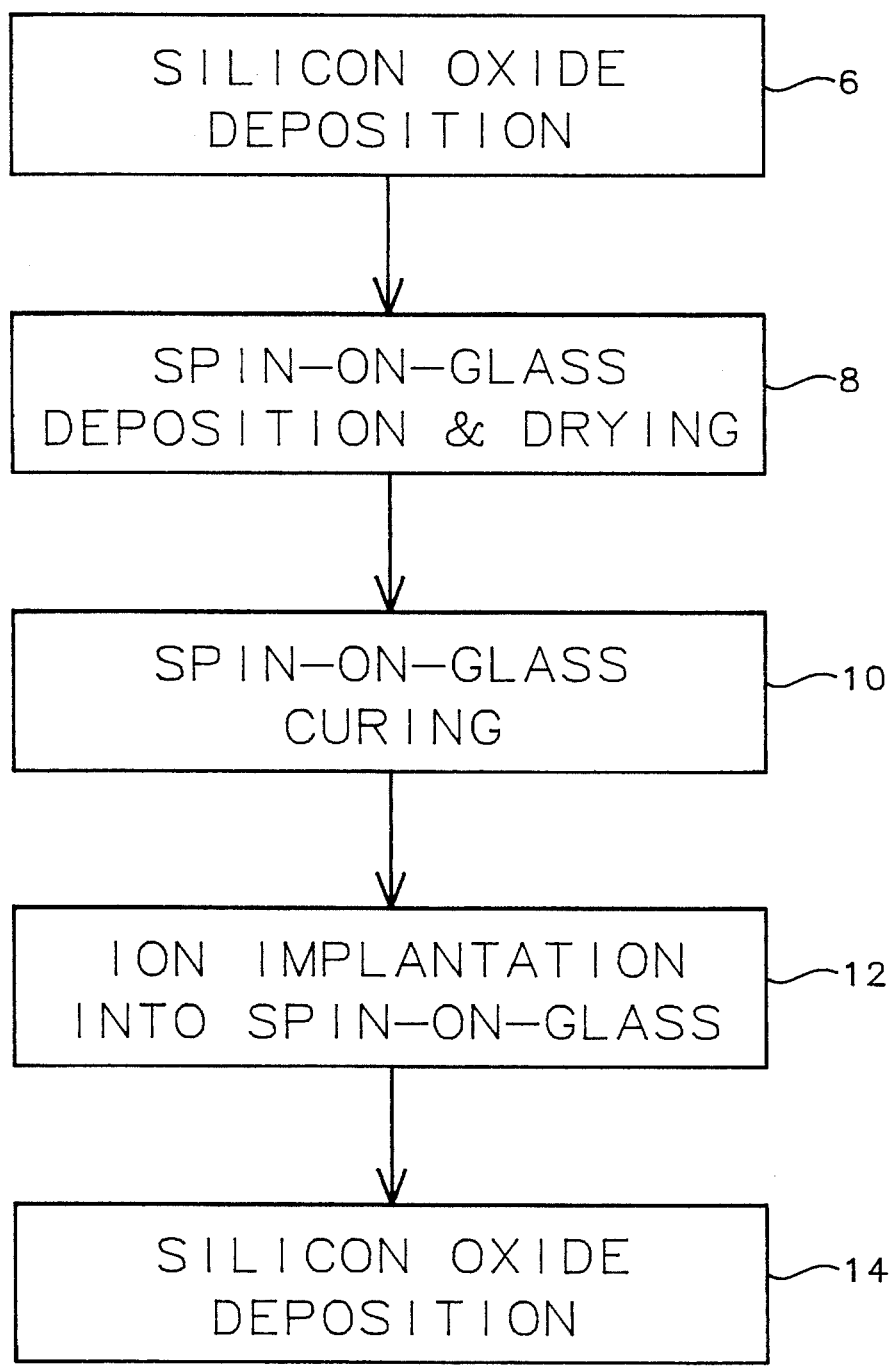
FIG. 1 shows the preferred method for forming the spin-on-glass intermetal dielectric sandwich layer having the reduced susceptibility for moisture sorption and outgassing of the present invention.

Referring to FIG. 1, there is shown the preferred process outline for formation of the intermetallic dielectric spin-on-glass sandwich layer of the present invention. The dielectric sandwich layer can be formed between the contact metallurgy and the first level metallurgy, between the first level and the second level metallurgy or between successive metal layers for an integrated circuit as will be understood in the art. The spin-on-glass sandwich planarization process of the present invention is useful as a dielectric between all metal levels.

The spin-on-glass sandwich layer process begins by depositing a layer of silicon oxide over the conductive layer, such as metal or highly doped polysilicon layer, as given in step 6. The spin-on-glass layer is then deposited as given in step 8 by the usual spinning method.

Either a siloxane or a silicate spin-on-glass, or a mixture of the two materials, may be used in the present invention. The siloxane material is preferred. Either spin-on-glass coating composition contains a vehicle or solvent which must be removed by a low temperature drying or baking step. This step is preferably performed by baking the semiconductor wafer upon which the spin-on-glass composition has been coated on a hot plate at 150 C. to 300 C. for 1 to 2 minutes. The preferred coating thickness of the spin-on-glass layer at this point is 2000 to 6000 Angstroms.

In step 10, the spin-on-glass is more fully cured, typically by exposure to an elevated temperature. A typical process would include curing the spin-on-glass at 425 C. to 450 C. for a period of 30 to 60 minutes.

In step 12, the ion implantation process of this invention is described. Although it is not fully understood, it is believed that the ion implantation process causes significant chemical, physical and/or other modifications to the spin-on-glass. Chemical bonds, such as —OH (hydroxyl) and —CH3 (methyl), are broken or otherwise reduced in many ways. The film density of the spin-on-glass layer may increase substantially, and the quality of the layer will be similar to that of a vacuum deposited conformal silicon oxide coating, in the sense that the spin-on-glass layer will not be susceptible to moisture sorption and outgassing. Further, the spin-on-glass layer will not exhibit moisture sorption through the entirety of the sidewall region exposed when via holes are etched through the spin-on-glass sandwich layer to reach an underlying metal layer.

Finally, the last step in the process for formation of the spin-on-glass interlevel dielectric sandwich layer of the present invention is the deposition of a silicon oxide top layer, as shown in step 14.

Figure 2:
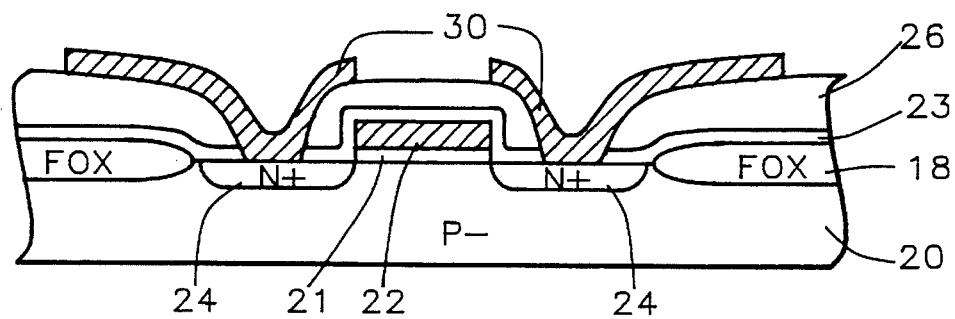
FIG. 2 to FIG. 4 show cross-sectional representations of the preferred embodiments of the invention.
Figure 3:
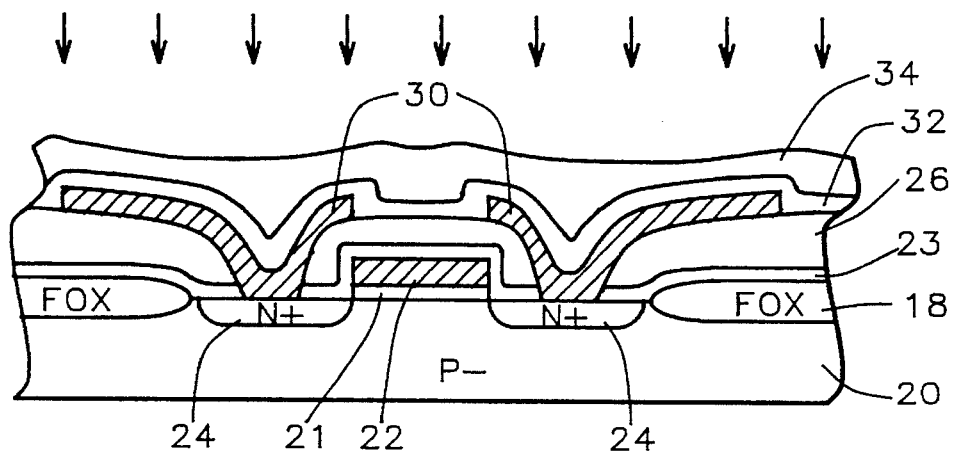
Figure 4:
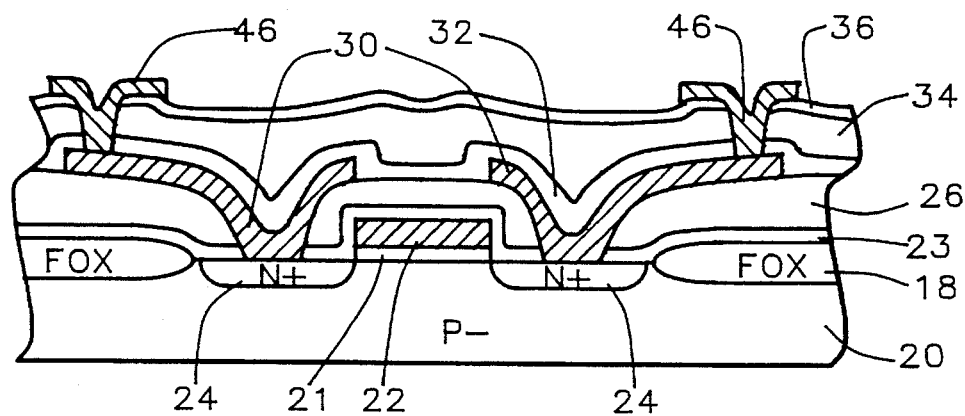

Referring now more particularly to FIG. 2 through FIG. 4, schematic diagrams are shown which describe the fashion by which the intermetallic dielectric spin-on-glass sandwich layer of FIG. 1 is incorporated into a metal-oxide-semiconductor field effect transistor (MOSFET).

FIG. 2 is an illustration of a partially completed, single N channel MOSFET. The first series of steps used to produce the structure of FIG. 2 involves the formation of the dielectric regions 18 for isolating adjoining semiconductor surface regions in the semiconductor substrate 20. The semiconductor substrate is preferably composed of silicon having a (100) crystallographic orientation. The dielectric isolation regions 18 between adjoining semiconductor surface regions are only partially shown in FIG. 2. They are conventionally referred to as Field Oxide (FOX) regions.

Since dielectric isolation processes are well known in the art, complete details of that process will not be given here. Nonetheless, a typical method for dielectric isolation of semiconductor surface regions is described by Kooi et al in U.S. Pat. No. 3,970,486. Described in that patent is a method where certain selected surface portions of a silicon semiconductor substrate are masked against oxidation, and then the exposed unmasked surface is oxidized to grow a thermal oxide which in effect sinks into the silicon surface at the unmasked areas. Through this process, the masked silicon remains as a mesa surrounded by the sunken silicon dioxide FOX region 18. Semiconductor devices can then be fabricated within the silicon mesas according to the following processes.

To fabricate semiconductor devices within semiconductor surface regions defined by the FOX pattern, the surface of the silicon substrate 20 is first thermally oxidized to form the desired thickness of the gate oxide 21. The preferred thickness is about 70 to 200 angstroms. The surface of the semiconductor wafer is then blanketed with a conventional thickness of a polysilicon layer, through a Low Pressure Chemical Vapor Deposition (LPCVD) method. The polysilicon layer is then ion implanted with phosphorus or arsenic ions by conventional methods and dosages, or doped with phosphorus oxychloride (POC13) at about 900 C., to render the polysilicon layer conductive. Finally, the polysilicon layer and the underlying oxide layer are patterned by lithographic and etching techniques as are conventional in the art to produce an aligned polysilicon gate 22 and gate oxide 21.

The source/drain structure of the MOSFET may now be formed by conventional methods. FIG. 2 shows an N channel MOSFET integrated circuit device wherein the substrate or well is doped as P—. However, it is well understood by those skilled in the art that a P channel FET integrated circuit device could also be formed by simply substituting opposite polarities to those given in the N channel embodiment. Also, a Complementary Metal Oxide Semiconductor (CMOS) FET could also be formed in a similar way by making both N channel and P channel devices upon the same substrate.

FIG. 2, for example, shows the source/drain device regions 24 within the substrate as N+ doped regions. These N+ doped regions may be formed by ion implantation as is well known in the art. After formation of these source/drain regions 24, the semiconductor wafer surface is coated with a layer of conformal oxide 23.

A passivation or insulating layer 26 is now formed over the conformal oxide layer 23. This layer may be composed of multilayers, such as a thin layer of silicon oxide and a much thicker layer of borophosphosilicate glass, phosphosilicate glass or similar insulating material. The operational thicknesses of these layers are between about 1000 to 2000 Angstroms for the oxide layer and between about 5000 to 6000 or more Angstroms for the glass layer. These layers are typically deposited by CVD processes under low pressure or atmospheric conditions, or in a plasma enhanced reactive chamber.

The contact windows are then formed through the insulating structure to the source/drain regions 24. Conventional lithography and etching techniques are used to form this pattern of openings.

The first metallurgy contact layer 30 is now formed by blanket deposition of the desired metallurgy over the surface of the structure and within the pattern of contact window openings. The metallurgy is preferably an Aluminum/Silicon/Copper alloy (Al/Si/Cu) coated over a Titanium/Tungsten (Ti/W) barrier layer. The total thickness of metals is between about 5,000 to about 7,000 Angstroms. However, many other metallurgic connections and thicknesses may be used, including but not limited to Aluminum/Silicon, dual-doped polysilicon, Titanium Silicide, Titanium Nitride, CVD Tungsten and polycides. The metallurgy may be deposited by several methods, including but not limited to evaporation, sputtering and CVD. The first metal layer is now patterned into the desired conductive lines by conventional lithography and etching techniques to form the pattern of metal layer 30 in FIG. 2.

Referring now more particularly to FIG. 3, the usual first dielectric silicon oxide layer 32 of the spin-on-glass sandwich planarization structure in now formed upon the metallurgy pattern 30 by a Plasma Enhanced Chemical Vapor Deposition (PECVD) silicon oxide deposition process. The preferred PECVD oxide thickness is 1000 to 4000 Angstroms.

Deposition of the first PECVD oxide is followed by the creation of the spin-on-glass layer 34. The spin-on-glass material, which is suspended in a solvent or carrier, is deposited on the semiconductor wafer surface and uniformly spread thereover by action of spinning the wafer. The material fills the indentations in the integrated circuit wafer surface, that is planarization.

Most of the vehicle or solvent remaining within the spin-on-glass coating is driven off by a low temperature baking step. The preferred low temperature baking conditions for the spin-on-glass of the present invention are a temperature of 150 C. to 300 C. for a time of 1 to 2 minutes. After the low temperature baking, the spin-on-glass layer is more fully cured under higher temperature conditions. The preferred high temperature cure conditions for the present invention are a temperature of 425 C. to 450 C. for a time period of 30 to 60 minutes. The preferred spin-on-glass coating thickness after high temperature curing is approximately 2,000 to 6,000 Angstroms.

The claimed ion implantation causes the production of spin-on-glass dielectric sandwich layers of the present invention, which are not substantially susceptible to the sorption and outgassing of moisture. Although it is most preferred that the ion implantation process be undertaken on the spin-on-glass layer after the layer has been cured at higher temperature, it is also possible to achieve high quality spin-on-glass layers not susceptible to moisture sorption and outgassing by undertaking the ion implantation process between the low temperature bake process and the high temperature bake process.

The ion implantation process is preferable done within an ion implantation chamber. The preferred conditions for ion implantation are Phosphorus implanting ions (P) at an implanting dose of 5E13 to 1E15 ions/cm2, and an implanting energy of 150 to 400 keV. The most preferred conditions for ion implantation are Phosphorus implanting ions at 2E14 ions/cm2 implanting dose and 300 keV implanting energy.

The present invention also anticipates that other ion implantation conditions may also provide spin-on-glass layers which are not susceptible to the sorption and outgassing of moisture. There are several combinations of implanting ions, doses and energies which are effective. In addition to Phosphorus ion implantation, both Silicon (Si) and Argon (Ar) ions may also be used at a preferred implanting dose of 5E13 to 1E15 ions/cm2 and a preferred implanting energy of 150 to 400 keV. The common implanting ion Arsenic (As) has also been found to be useful in achieving the present invention. Preferred conditions for Arsenic ion implanting are 2E13 to 5E14 ions/cm2 implanting dose and implanting energy of 300 to 800 keV. Finally, several lighter elements also be used to achieve the goals of the present invention. These elements include Boron (B), Nitrogen (N), Oxygen (O) and Fluorine (F). Preferred conditions for implanting of these lighter elements include an implanting dose of 1E15 to 5E16 ions/cm2 and an implanting energy of 50 to 200 keV.

FIG. 4 illustrates the deposition of the second layer of PECVD oxide 36 which forms the top layer of the spin-on-glass sandwich structure consisting of layers 32, 34 and 36. Via openings are made through the spin-on-glass sandwich structure using conventional lithographic and etching techniques. Contact is made to the first metal layer 30 by a second metal layer 46, which is deposited into the etched via opening. The second metal layer 46 is patterned by conventional lithography and etching techniques to complete construction of the desired FET structure shown in FIG. 4. It is of course understood by those skilled in the art that further layers of spin-on-glass sandwich can be formed to allow further metallurgy to be applied over the structure shown in FIG. 4.

EXAMPLES

A siloxane spin-on-glass sandwich layer (Allied Signal Type III) was used as an insulating layer for several semiconductor test wafers which contained test structures consisting of multiple vias through an insulating layer. The purpose of the test structure is to determine the integrity of via construction and via metallization processes.

The spin-on-glass sandwich layer used in the test structure contained a spin-on-glass layer which was approximately 3000 angstroms thick. The spin-on-glass layer was deposited and cured in a fashion consistent with the preferred embodiment of this invention. The spin-on-glass layer was then exposed to Phosphorus ion implantation, also in accord with the preferred embodiment of this invention, after the high temperature cure of the layer and prior to overcoating the layer with the second PECVD oxide cover layer of the spin-on-glass sandwich.

The spin-on-glass sandwich layer was then lithographically patterned and a series of 0.55 micron×0.55 micron via holes was etched through the sandwich layer. The lithographic photoresist mask was removed by oxygen plasma ashing, and a patterned metallization was formed through and connecting the multiple via holes. Measurement of the electrical resistance through the multi-via test structure chain was then undertaken using conventional electrical measurement techniques. The results of these measurements, in comparison with a control wafer which received no ion implantation into the spin-on-glass layer, are summarized in Table I. Resistance values are reported as mean values +/−3 sigma; units are ohms/via.

TABLE I

| Example | Ion   | Dosage | keV | Resistance      |
|---------|-------|--------|-----|-----------------|
| 1       | No I/I | —     | —   | 1.52 ± 1.47     |
| 2       | P     | 2E14   | 300 | 0.44 ± 0.09     |

From the data listed in Example 2 it is seen that ion implantation of Phosphorus ions within the limits of this invention provides a spin-on-glass sandwich layer through which multiple vias may be formed and filled without compromise of the conductivity of the metal filling the vias. In comparison, Example 1 shows that the absence of an ion implant process for modification of the spin-on-glass layer provides a spin-on-glass sandwich dielectric layer through which only highly resistive vias may be formed.

EXAMPLES 3–4

Siloxane (Allied Signal III) spin-on-glass was coated onto two semiconductor wafers to yield a cured coating thickness on each of the wafers of approximately 5000 angstroms. The coating and curing processes used to form these layers were consistent with the methods outlined in the preferred embodiment of this invention. One of the wafers was subsequently ion implanted with Phosphorus ions at 2E14 ions/cm2 implantation dosage and 300 keV ion implantation energy. The other wafer received no ion implant treatment. A Fourier Transform Infrared (FTIR) spectrum was obtained of the spin-on-glass surface layer on each of the two wafers.

Both wafers were then exposed to an oxygen plasma ash process similar to that used for etch mask photoresist removal after via holes are etched through a dielectric insulator layer. Similarly, an FTIR spectrum was obtained for the spin-on-glass surface layer on each of the two wafers after exposure to the oxygen ash process.

Figure 5:
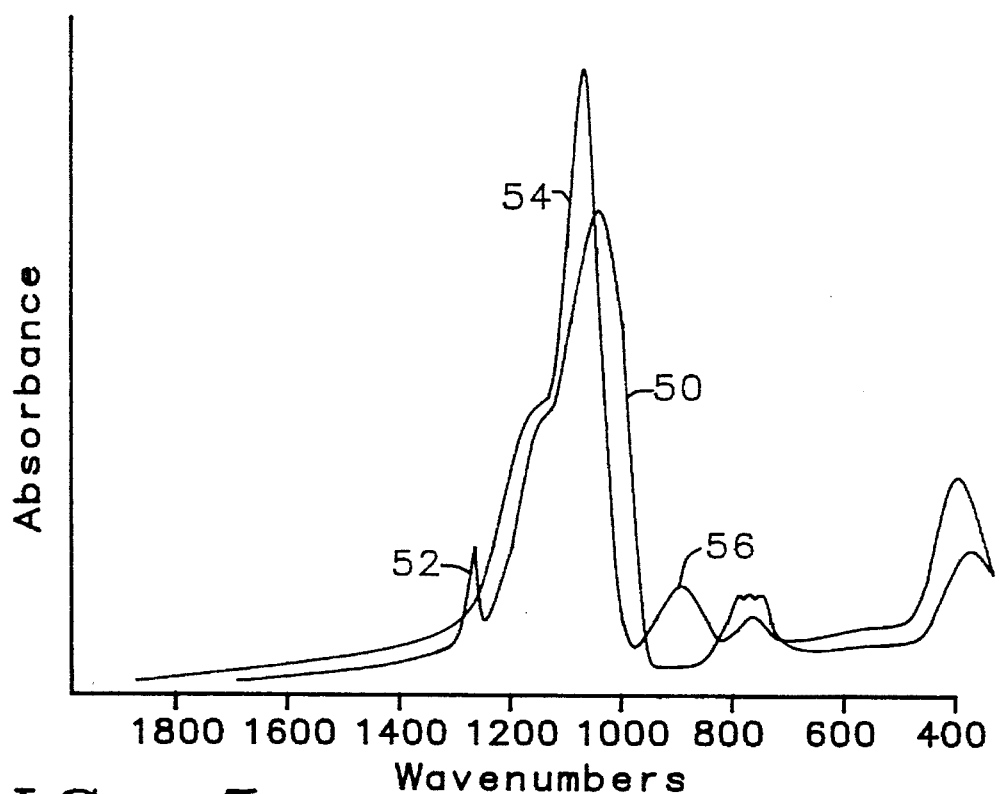
FIG. 5 and FIG. 6. show chemical effects of ion implantation and oxygen ashing of siloxane spin-on-glass films.
Figure 6:
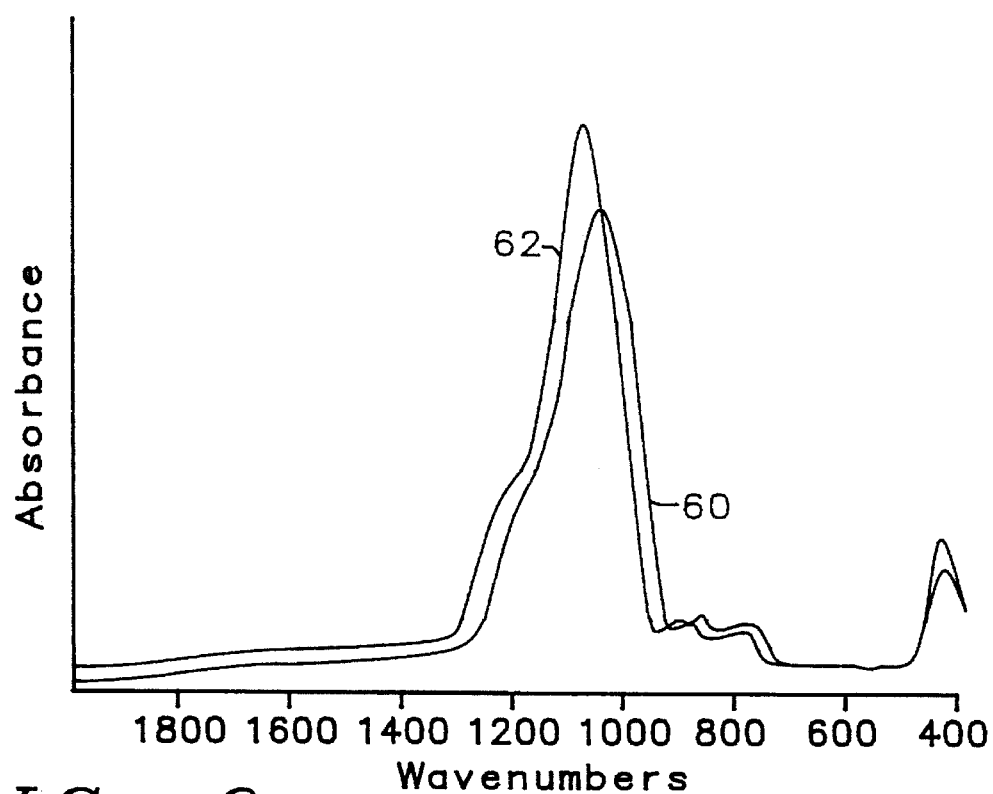

The four resulting FTIR spectra are shown in FIG. 5 and FIG. 6. FIG. 5 shows the infrared spectra of the cured and unimplanted siloxane spin-on-glass layer both before and after the oxygen plasma ash process. Curve 50 is the spectrum of the material before the oxygen plasma treatment. Curve 54 is the spectrum of the same material after oxygen plasma treatment. A major feature of curve 50 is the presence of an absorption band near 1250 wavenumbers 52, which is attributable to a stretching vibration of the silicon-organic methyl bond in the siloxane spin-on-glass material. This feature is absent in the spectrum of the unimplanted siloxane spin-on-glass after exposure to oxygen plasma ash processing 54. Instead, a new band has grown in the spectrum 54 at approximately 920 wavenumbers 56. This new band is attributable to a silicon-hydroxyl bond. It is this silicon-hydroxyl bond which is believed to be responsible for sorption and outgassing of moisture which causes metallurgy and via resistance problems in spin-on-glass films which are not ion implanted.

In contrast, the FTIR spectra of the ion implanted spin-on-glass layers are show in FIG. 6. Curve 60 shows the spectrum of the cured and implanted layer prior to oxygen plasma. Curve 62 shows the FTIR spectrum of the same layer after exposure to the oxygen plasma ash process. Noticeably absent from both of these spectra are both the silicon-organic methyl vibration at 1250 wavenumbers and the silicon-hydroxyl absorption at 920 wavenumbers. In particular, the absence of the silicon-hydroxyl absorption at 920 wavenumbers is believed to indicate that moisture sorption and outgassing is unlikely for these films. This indication is consistent with the lower via resistivity observations for the ion implanted film as shown in Example 2.

EXAMPLES 5–17

Thermal oxide layers were formed on the surfaces of several silicon test wafers. Individual wafers were then ion implanted with Arsenic, Phosphorus or Boron ions at a constant implant energy of 50 keV, but with differing implant dosages in the range of 10E12 to 10E16 ions/cm2. The etch rates of the ion implanted thermal oxide layers were measured, using 10:1 dilute HF etchant, in order to determine the threshold ion implant dosage level beyond which physical damage occurs to the oxide layer. The level of physical damage correlates with increased etch rate of the oxide film coating. The results of these experiments are shown in Table II.

TABLE II

| Example | Ion | Dose | Angstroms Etched per Minute |
|---|---|---|---|
| 5 | No I/I | — | 400 |
| 6 | P | 10E12 | 400 |
| 7 | P | 10E13 | 400 |
| 8 | P | 10E14 | 1100 |
| 9 | P | 10E15 | 1400 |
| 10 | P | 10E16 | 1600 |
| 11 | As | 10E12 | 400 |
| 12 | As | 10E13 | 600 |
| 13 | As | 10E14 | 1000 |
| 14 | B | 10E12 | 400 |
| 15 | B | 10E13 | 400 |
| 16 | B | 10E14 | 700 |
| 17 | B | 10E15 | 1400 |

The results of Table II show that a dosage threshold exists above which ion implantation damage occurs in a thermal oxide film. For ions implanted at 50 keV, the minimum threshold above which substrate damage occurs in thermal oxide films is in the 10E12 to 10E14 ions/cm2 range.

Particularly important from Table II is the observation that the relatively light implanting ion Boron also yields significant thermal oxide substrate damage within the implantation dosage and implantation energy evaluated. Based upon this observation, Boron and other common light implanting ions such as Nitrogen, Oxygen and Fluorine should also be valuable as implanting ions in practicing the present invention.

What is claimed is:

1. A method for forming a moisture sorption and outgassing resistant spin-on-glass sandwich layer for integrated circuit applications, comprising:

forming a first layer of silicon oxide over an integrated circuit surface;

depositing a spin-on-glass layer over the first silicon oxide layer;

thermally curing the spin-on-glass layer to form a cured spin-on-glass layer;

implanting ions selected from the group of ions consisting of Monoatomic Boron, Nitrogen, Oxygen and Monoatomic Fluorine ions into and through the cured spin-on-glass layer, the ions being of sufficient dosage and energy to cause structural changes within the complete depth of the cured spin-on-glass layer, which structural changes cause the cured spin-on-glass layer to be moisture sorption and outgassing resistant; and depositing a second silicon oxide layer over the cured span-on-glass layer.

2. The method of claim 1 wherein the ion implant dose is between 1E15 and 5E16 ions/cm2.

3. The method of claim 1 wherein the ion implant energy is between 50 and 200 keV.

4. The method of claim 1 wherein the spin-on-glass layer is cured at a temperature of 400 to 500 degrees centigrade for a time period of 30 to 120 minutes.

5. A method for forming a moisture sorption and outgassing resistant spin-on-glass sandwich layer for integrated circuit applications, comprising:

forming a first layer of silicon oxide over an integrated circuit surface;

depositing a spin-on-glass layer over the first silicon oxide layer;

implanting ions selected from the group of ions consisting of Boron, Nitrogen, Oxygen and Fluorine ions into and through the spin-on-glass layer, the ions being of sufficient dosage and energy to cause structural changes within the complete depth of the spin-on-glass layer, which structural changes cause the spin-on-glass layer to be not susceptible to moisture sorption and outgassing;

thermally curing then the spin-on-glass layer to form a cured spin-on-glass layer; and depositing a second silicon oxide layer over the cured spin-on-glass layer.

6. The method of claim 5 wherein the ion implant dosage is between 1E15 and 5E16 ions/cm2, and the thermal curing is done at a temperature of between 400 C. to 500 C.

7. The method of claim 6 wherein the ion implant energy is between 50 and 200 keV.

8. A method of providing a moisture sorption and outgassing resistant spin-on-glass layer of a planarized MOSFET multilayered metal structure comprising:

providing a MOSFET semiconductor structure in and on a semiconductor substrate;

providing a first conductive layer for contacting the active elements of the MOSFET structure;

providing a first insulator layer over the first conductive layer;

depositing a spin-on-glass layer over the first insulator layer;

curing the spin-on-glass layer to form a cured spin-on-glass layer;

implanting of ions selected from the group of ions consisting of Monoatomic Boron, Nitrogen, Oxygen and Monoatomic Fluorine ions into and through the cured spin-on-glass layer, the ions being applied in sufficient dosage and energy to cause structural changes within the complete depth of the cured spin-on-glass layer, which structural changes cause the cured spin-on-glass layer to be not susceptible to moisture sorption and outgassing;

forming a second insulator layer over the ion implanted cured spin-on-glass layer;

forming openings through the first and second insulator layers and the cured spin-on-glass layer to the conductive layer; and depositing a second conductive layer into the openings to make contact to the first conductive layer and complete the MOSFET multilayer metal structure.

9. The method of claim 8 wherein:

the ion implantation dosage is between 1E15 and 5E16 ions/cm2; and the ion implantation energy is between 50 and 200 keV.

10. The method of claim 8 wherein the spin-on-glass layer is cured at 400 to 500 degrees centigrade for 30 to 120 minutes.

* * * * *